United States Patent
Deweerd et al.

(10) Patent No.: US 8,722,504 B2
(45) Date of Patent: May 13, 2014

(54) INTERFACIAL LAYER FOR DRAM CAPACITOR

(75) Inventors: Wim Deweerd, San Jose, CA (US); Hiroyuki Ode, Higashihiroshima (JP)

(73) Assignees: Intermolecular, Inc., San Jose, CA (US); Elpida Memory, Inc., Tokyo (JP)

( * ) Notice: Subject to any disclaimer, the term of this patent is extended or adjusted under 35 U.S.C. 154(b) by 31 days.

(21) Appl. No.: 13/238,218

(22) Filed: Sep. 21, 2011

(65) Prior Publication Data

US 2013/0071988 A1 Mar. 21, 2013

(51) Int. Cl.
*H01L 21/20* (2006.01)

(52) U.S. Cl.
USPC ............ 438/393; 438/381; 438/396; 438/238; 438/240

(58) Field of Classification Search
USPC .......................... 438/393, 381, 396, 238, 240
See application file for complete search history.

(56) References Cited

U.S. PATENT DOCUMENTS

| | | | |
|---|---|---|---|
| 5,250,456 A | 10/1993 | Bryant | |
| 2007/0048926 A1* | 3/2007 | Ahn et al. | 438/216 |
| 2008/0268605 A1* | 10/2008 | Ahn et al. | 438/386 |
| 2010/0172065 A1* | 7/2010 | Huang et al. | 361/313 |
| 2010/0330269 A1* | 12/2010 | Chen et al. | 427/123 |
| 2011/0014359 A1* | 1/2011 | Hashim et al. | 427/80 |
| 2011/0079764 A1* | 4/2011 | Nishihara et al. | 257/3 |
| 2011/0203085 A1* | 8/2011 | Chen et al. | 29/25.42 |
| 2012/0262835 A1* | 10/2012 | Ramani et al. | 361/271 |
| 2012/0287553 A1* | 11/2012 | Ramani et al. | 361/301.4 |
| 2012/0309160 A1* | 12/2012 | Ramini et al. | 438/381 |
| 2012/0309162 A1* | 12/2012 | Chen et al. | 438/396 |
| 2012/0322220 A1* | 12/2012 | Chen et al. | 438/381 |
| 2012/0322221 A1* | 12/2012 | Chen et al. | 438/381 |

OTHER PUBLICATIONS

Kittl, J., et al.; High-k dielectrics for future generation memory devices (Invited Paper); 2009; Elsevier B.V.; Microelectronic Engineering, pp. 1789-1795.
Chowdhury, M., et al.; High-k Dielectrics for Submicron MOSFET; Jul. 2010; IJETSE International Journal of Emerging Technologies in Sciences and Engineering, vol. 2, No. 2, pp. 1-12.

* cited by examiner

*Primary Examiner* — Telly Green

(57) ABSTRACT

A method for reducing leakage current in DRAM capacitor stacks by introducing dielectric interface layers between the electrodes and the bulk dielectric material. The dielectric interface layers are typically amorphous dielectric materials with a k value between about 10 and about 30 and are less than about 1.5 nm in thickness. Advantageously, the thickness of each of the dielectric interface layers is less than 1.0 nm. In some cases, only a single dielectric interface layer is used between the bulk dielectric material and the second electrode.

20 Claims, 5 Drawing Sheets

INTERFACIAL LAYER FOR DRAM CAPACITOR

This document relates to the subject matter of a joint research agreement between Intermolecular, Inc. and Elpida Memory, Inc

FIELD OF THE INVENTION

The present invention generally relates to the field of dynamic random access memory (DRAM), and more particularly to dielectric material processing for improved DRAM performance.

BACKGROUND OF THE INVENTION

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d (i.e. the physical thickness of the dielectric layer), and the relative dielectric constant or k-value of the dielectric material. The capacitance is given by:

$$C = \kappa \varepsilon_o \frac{A}{d} \quad \text{(Eqn. 1)}$$

where $\varepsilon_o$ represents the vacuum permittivity.

The dielectric constant is a measure of a material's polarizability. Therefore, the higher the dielectric constant of a material, the more charge the capacitor can hold. Therefore, if the k-value of the dielectric is increased, the area of the capacitor can be decreased and maintain the desired cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A cm$^{-2}$). The physical thickness of the dielectric layers in DRAM capacitors could not be reduced unlimitedly in order to avoid leakage current caused by tunneling mechanisms which exponentially increases as the thickness of the dielectric layer decreases.

Traditionally, SiO$_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the SiO$_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

One class of high-k dielectric materials possessing the characteristics required for implementation in advanced DRAM capacitors are high-k metal oxide materials. Examples of suitable dielectric materials comprise SiO$_2$, a bilayer of SiO$_2$ and Si$_x$N$_y$, SiON, Al$_2$O$_3$, HfO$_2$, HfSiO$_x$, ZrO$_2$, Ta$_2$O$_5$, TiO$_2$, Nb$_2$O$_5$, SrTiO$_3$ (STO), BaSrTiO$_x$ (BST), PbZr-TiO$_x$ (PZT), etc. TiO$_2$ and ZrO$_2$ are two specific examples of metal oxide dielectric materials which display significant promise in terms of serving as a high-k dielectric material for implementation in DRAM capacitors.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of SiO$_2$ (k=3.9). For DRAM capacitors, the goal is to utilize dielectric materials with k values greater than about 40. Such materials are generally classified as high-k materials. Representative examples of high-k materials for MIM capacitors are non-conducting metal oxides, non-conducting metal nitrides, non-conducting metal silicates or combinations thereof. These dielectrics may also include additional dopant materials.

A figure of merit in DRAM technology is the electrical performance of the dielectric material as compared to SiO$_2$ known as the Equivalent Oxide Thickness (EOT). A high-k material's EOT is calculated using a normalized measure of silicon dioxide (SiO$_2$ k=3.9) as a reference, given by:

$$EOT = \frac{3.9}{\kappa} \cdot d \quad \text{(Eqn. 2)}$$

where d represents the physical thickness of the capacitor dielectric.

As DRAM technologies scale below the 40 nm technology node, manufacturers must reduce the EOT of the high-k dielectric films in MIM capacitors in order to increase charge storage capacity. The goal is to utilize dielectric materials that exhibit an EOT of less than about 0.8 nm while maintaining a physical thickness of about 5-20 nm.

Generally, as the dielectric constant of a material increases, the band gap of the material decreases. For example. The rutile phase of TiO$_2$ has a k-value of about 80 and a band gap of about 3.0 eV while ZrO$_2$ in the tetragonal phase has a k-value of about 43 and a band gap of about 5.8 eV. The low band gap may lead to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric layer within the DRAM capacitor. Metals, such as platinum, gold, ruthenium, and ruthenium oxide are examples of high work function electrode materials suitable for inhibiting device leakage in a DRAM capacitor having a high-k dielectric layer. The noble metal systems, however, are prohibitively expensive when employed in a mass production context. Moreover, electrodes fabricated from noble metals often suffer from poor manufacturing qualities, such as surface roughness, poor adhesion, and form a contamination risk in the fab.

Leakage current in capacitor dielectric materials can be due to Schottky emission, Frenkel-Poole defects (e.g. oxygen vacancies ($V_{ox}$) or grain boundaries), or Fowler-Nordheim tunneling. Schottky emission, also called thermionic emission, is a common mechanism and is the thermally activated flow of charge over an energy barrier whereby the effective barrier height of a MIM capacitor controls leakage current. The nominal barrier height is a function of the difference between the work function of the electrode and the electron affinity of the dielectric. The electron affinity of a dielectric is closely related to the conduction band offset of the dielectric. The Schottky emission behavior of a dielectric layer is generally determined by the properties of the dielectric/electrode interface. Frenkel-Poole emission allows the conduction of charges through a dielectric layer through the interaction with defect sites such as vacancies, grain boundaries, and the like. As such, the Frenkel-Poole emission behavior of a dielectric layer is generally determined by the dielectric layer's bulk properties. Fowler-Nordheim emission allows the conduction of charges through a dielectric layer through direct tunneling without any intermediary interaction with e.g. defects. As such, the Fowler-Nordheim emission behavior of a dielectric layer is generally determined by the physical thickness of the dielectric layer. This leakage current is a primary driving force in the adoption of high-k dielectric materials. The use of high-k materials allows the physical thickness of the dielectric layer to be as thick as possible while maintaining the required capacitance (see Eqn 1 above).

The mechanisms for charge transport discussed above suggest that there are several parameters that influence the leakage current across the metal-dielectric interface. Examples of the parameters include physical thickness of the dielectric material, the band gap of the dielectric material, the work function of the metal, the Schottky barrier height (SBH) between the metal and the dielectric material, etc. The SBH has been found to be influenced by many variables such as the composition of the metal and the dielectric, doping levels, defect densities, processing conditions, etc. However, as discussed in the review article by Tung (Materials and Science Engineering, R35, (2001), pgs. 1-138) which is herein incorporated by reference, in an ideal case, the SBH, $\Phi^0_{B,n}$, is the difference between the work function, $\phi_m$, of the metal and the electron affinity, $\chi_s$, of the dielectric as illustrated in Eqn. 3 based on the Schottky-Mott theory.

$$\Phi^0_{B,n} = \phi_m - \chi_s \quad \text{(Eqn. 3)}$$

Eqn. 3 implies that the variation of the SBH with respect to the work function, $S_\phi$, of the metal should be 1 for a given dielectric material as illustrated in Eqn. 4. This quantity, $S_\phi$, is defined as the interface behavior parameter or simply the S-parameter. Experimentally, this has been found to be less than 1, indicating that there are additional factors that influence the SBH. As illustrated in FIG. 1, if the S-parameter is close to 1, then the interface behaves close to the ideal case (line 102). If the S-parameter is 0, then the SBH is not influenced by the work function of the metal (line 104). Generally, the S-parameter has a value between 0 and 1, meaning that the SBH is influenced by the work function of the metal as well as other factors (line 106). Note, line, 106, is for illustrative purposes only and does not represent a specific dielectric material.

$$S_\phi = \partial \Phi^0_{B,n} / \partial \phi_m = 1 \quad \text{(Eqn. 4)}$$

As discussed previously, one of the methods for reducing the leakage current in capacitors is to use metal electrode materials with a high work function. However, if the S-parameter of the dielectric is close to 0, then the use of metal electrode materials with a high work function will not improve the leakage current.

Therefore, there is a need to develop methods for improving the leakage current in capacitors using a dielectric material that has a low S-parameter.

SUMMARY OF THE DISCLOSURE

In some embodiments of the present invention, a layer of a dielectric material having a wide band gap is formed between a metal electrode material and a bulk dielectric material to increase the effective Schottky barrier height.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Equation 1 above implies that the barrier height of a metal/dielectric stack can be increased by choosing metals with a high work function. This is desirable because as the barrier height is increased, the leakage current of the device generally decreases (i.e. the Schottky emission behavior is decreased). However, experimentally, this ideal relationship has not been observed. This phenomenon is often called "Fermi Level Pinning" in the literature (i.e. see Tung et al referenced earlier). Two possible mechanisms are believed to be responsible for this behavior. First, there is a theory that ascribes the behavior to the presence of metal induced gap states (MIGS) wherein a high density of surface states are introduced within the band gap of the dielectric material by the metal electrode. The presence of these states effectively pins the Fermi level of the dielectric. Second, a competing theory ascribes the behavior to the formation of dipoles at the interface. The dipoles form an additional electric field that influences the transport of charge.

Regardless of which of the theories mentioned above is correct, the barrier height of a metal/dielectric interface may be increased by inserting an interfacial dielectric layer between the metal and the bulk dielectric material. The interfacial dielectric layer should be thin (i.e. <about 1.5 nm) and should have a k value of between about 10 and about 30. Advantageously, the thickness of each of the interface dielectric layers is less than about 1.0 nm. The interfacial dielectric layer is advantageously amorphous with very few vacancies. The interfacial dielectric layer should have low polarization properties. Such a dielectric material will have a higher band gap and a lower electron affinity.

In FIGS. 2-5, below, a capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention.

Figure 1:
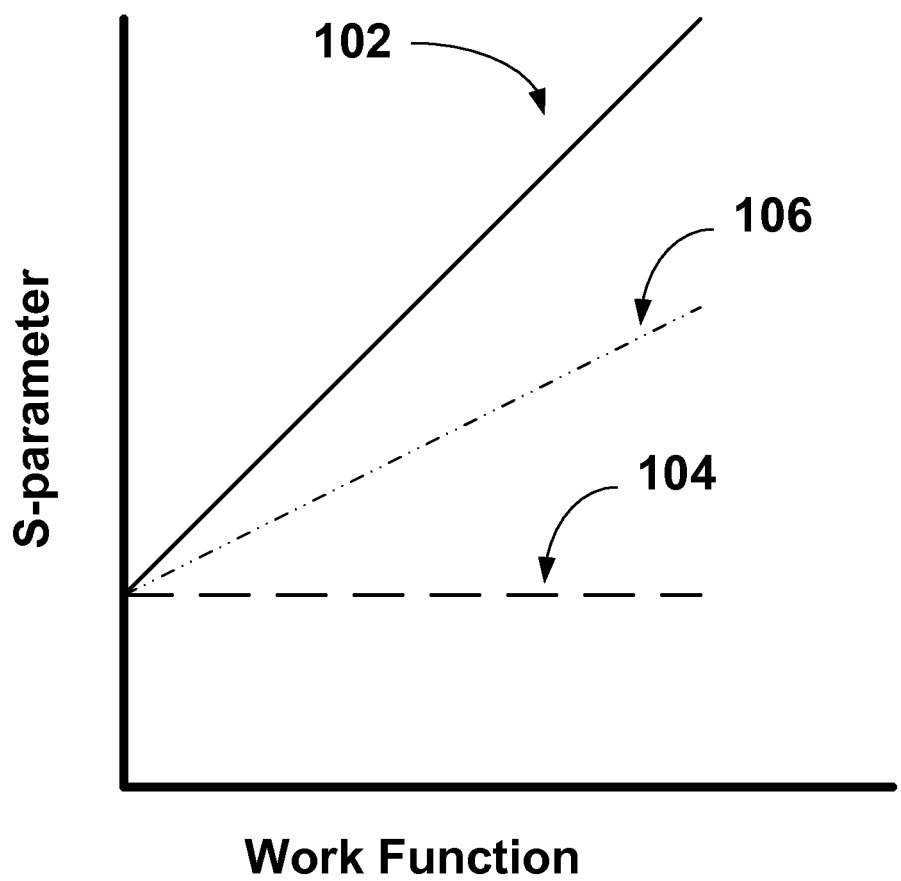
FIG. 1 illustrates a diagram illustrating a graph of the S-parameter versus the metal electrode work function.
Figure 2:
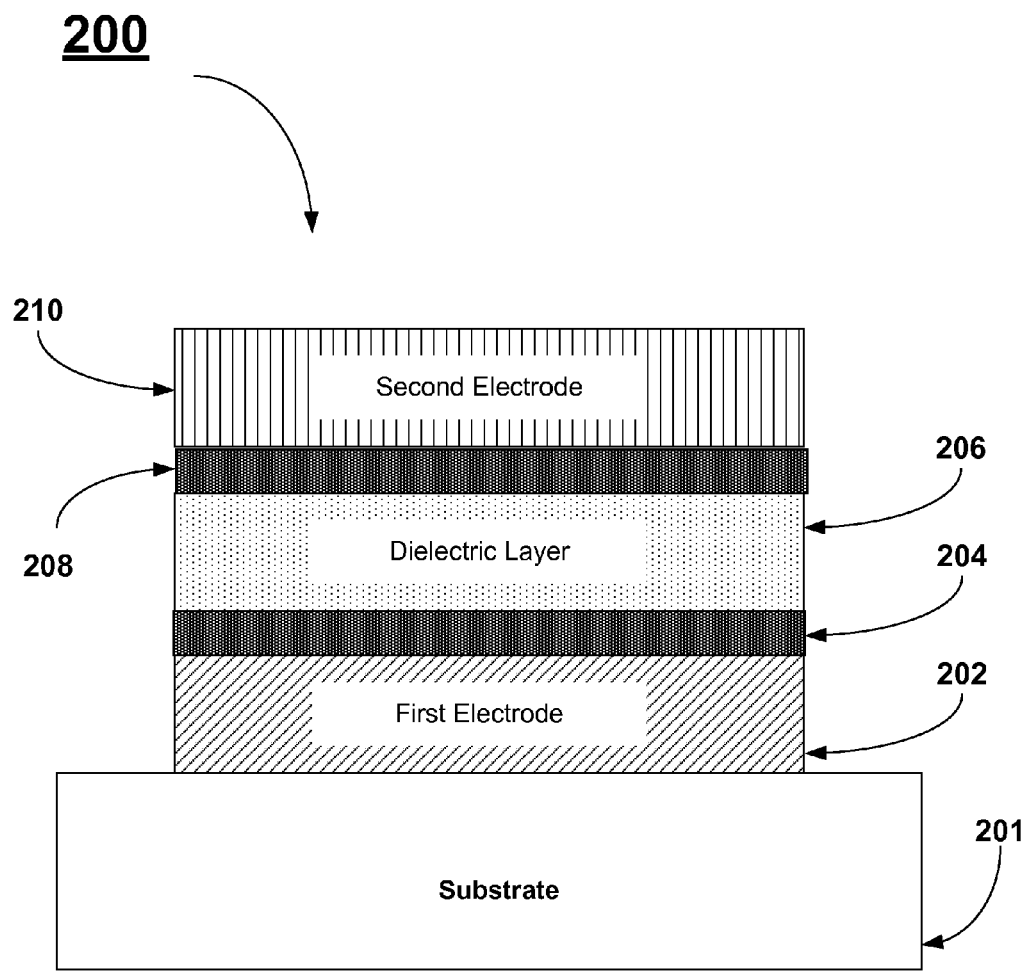
FIG. 2 illustrates a simplified cross-sectional view of a DRAM capacitor stack fabricated in accordance with some embodiments of the present invention.

FIG. 2 illustrates a simplified cross-sectional view of a DRAM capacitor stack fabricated in accordance with some embodiments of the present invention. First electrode layer, 202, is formed on substrate, 201. Generally, the substrate has already received several processing steps in the manufacture of a full DRAM device. First electrode layer, 202, comprises one of metals, metal alloys, conductive metal oxides, conductive metal nitrides, conductive metal silicides, etc. One class of materials that is of particular interest is the conductive metal oxides. Specific materials of interest comprise molybdenum oxide, tungsten oxide, ruthenium oxide, iron oxide, iridium oxide, chromium oxide, manganese oxide, tin oxide, cobalt oxide, or nickel oxide. Optionally, first electrode, 202, can be annealed to crystallize the material. First interface dielectric layer, 204, is formed on the first electrode. As mentioned previously, first interface dielectric layer, 204, is typically an amorphous dielectric material with a k value between about 10 and about 30 and is less than about 1.5 nm in thickness. Advantageously, the thickness of each of the interface dielectric layers is less than about 1.0 nm. Examples of materials that would make suitable first interface dielectric layers comprise $Al_2O_3$, $La_2O_3$, $Si_xN_y$, $Lu_2O_3$, $ZrO_2$, $Er_2O_3$, MgO, $Ga_2O_3$, or combinations thereof.

In the next step, bulk dielectric layer, 206, would then be formed on the first interface dielectric layer, 204. A wide variety of dielectric materials have been targeted for use in DRAM capacitors. Examples of suitable dielectric materials comprise $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $Nb_2O_5$, $SrTiO_3$ (STO), $BaSrTiO_x$ (BST), $PbZrTiO_x$ (PZT), or doped versions of the same. The bulk dielectric layer is a different material from the first interface dielectric layer. These bulk dielectric materials may be formed as a single layer or may be formed as a hybrid or nanolaminate structure. A specific dielectric material of interest is doped $TiO_2$. Typically, Al is a common dopant used in $TiO_2$ dielectrics to reduce the leakage current although many other dopants are also commonly used. A discussion of the doping of $TiO_2$ to reduce leakage current may be found in U.S. application Ser. No. 13/219,870 filed on Aug. 29, 2011, entitled "DOPING APPROACH OF TITANIUM DIOXIDE FOR DRAM CAPACITORS" and is incorporated herein by reference. Dopants described therein comprise one or more of Al, Ge, Sr, Y, La, Zr, Hf, Sc, Nd, Ce, In, Sn, Er, Gd, Mg, Mn, Lu, Pr, Co, S, Se, Te, C, F, Cl, Br, I, P, As, Sb, or Bi. Typically, bulk dielectric layer, 206, is subjected to a post dielectric anneal (PDA) treatment before the formation of the next dielectric interface layer.

Second interface dielectric layer, 208, is formed on the bulk dielectric layer. As mentioned previously, second interface dielectric layer, 208, is typically an amorphous dielectric material with a k value between about 10 and about 30 and is less than about 1.5 nm in thickness. Advantageously, the thickness of each of the interface dielectric layers is less than about 1.0 nm. Examples of materials that would make suitable second interface dielectric layers comprise $Al_2O_3$, $La_2O_3$, $Si_xN_y$, $Lu_2O_3$, $ZrO_2$, $Er_2O_3$, MgO, $Ga_2O_3$, or combinations thereof. Second interface dielectric layer is a different material from the bulk dielectric layer. The first and second interface dielectric layers may be the same material or may be different materials.

The next step, comprises forming a second electrode layer, 210, on the second interface dielectric layer. The second electrode layer may be a metal, metal alloy, conductive metal oxide, conductive metal nitride, conductive metal silicide, or combinations thereof, etc. One class of materials that is of particular interest is the conductive metal oxides. Specific materials of interest comprise molybdenum oxide, tungsten oxide, ruthenium oxide, iron oxide, iridium oxide, chromium oxide, manganese oxide, tin oxide, cobalt oxide, or nickel oxide. Additional candidates for the second electrode material comprise TiN, Ni, TiAlN, Pt, Ir, Pd, Ni, Co, NiN, WN, VN, MoN, CoN, Ru, $RuO_2$, NiO, or combinations thereof. The remaining full DRAM device (not shown) would then be manufactured using well known techniques. Optionally, the DRAM capacitor stack may undergo a post metallization anneal (PMA) treatment. Examples of the PDA treatment described above and the PMA treatment are further described in U.S. application Ser. No. 13/159,842 filed on Jun. 14, 2011, entitled "METHOD OF PROCESSING MIM CAPACITORS TO REDUCE LEAKAGE CURRENT" and is incorporated herein by reference.

Those skilled in the art will appreciate that each of the first electrode layer, the two interface dielectric layers, the bulk dielectric layer, and the second electrode used in the MIM DRAM capacitor may be formed using any common formation technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the DRAM capacitor structure, ALD, PE-ALD, AVD, or CVD are preferred methods of formation. However, any of these techniques are suitable for forming each of the various layers discussed below. Those skilled in the art will appreciate that the teachings described below are not limited by the technology used for the deposition process.

One issue with the DRAM capacitor stack described in reference to FIG. 2 is that the addition of the two interface dielectric layers may negatively impact the EOT value of the capacitor.

Figure 3:
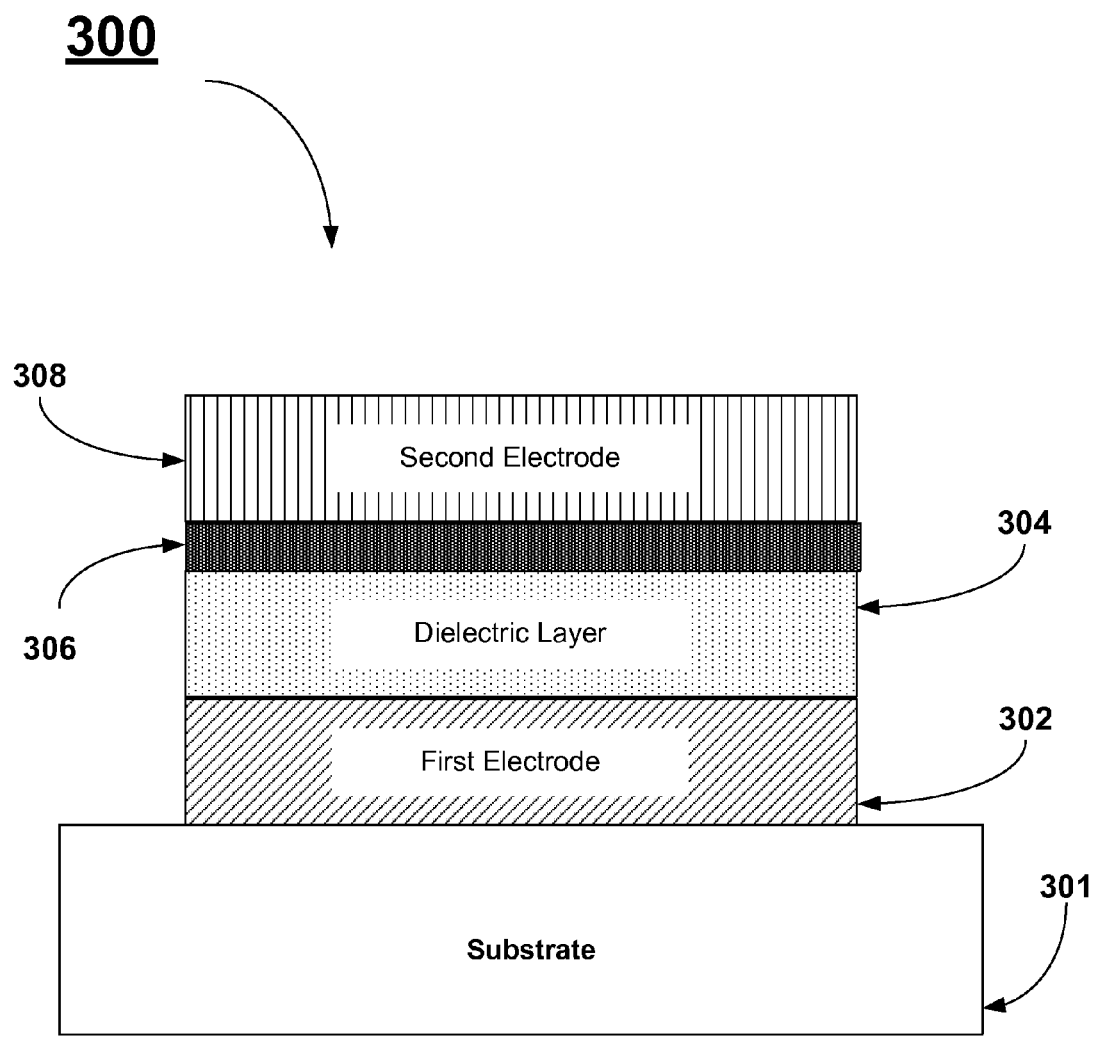
FIG. 3 illustrates a simplified cross-sectional view of a DRAM memory cell fabricated in accordance with some embodiments of the present invention.

FIG. 3 illustrates a simplified cross-sectional view of a DRAM capacitor stack fabricated in accordance with some embodiments of the present invention. In this configuration, only the second interface dielectric layer is used in the capacitor stack. This is beneficial for capacitors that are positively biased. That is, the second electrode is connected to a positive voltage source.

First electrode layer, 302, is formed on substrate, 301. Generally, the substrate has already received several processing steps in the manufacture of a full DRAM device. First electrode layer, 302, comprises one of metals, metal alloys, conductive metal oxides, conductive metal nitrides, conductive metal silicides, etc. One class of materials that is of particular interest is the conductive metal oxides. Specific materials of interest comprise molybdenum oxide, tungsten oxide, ruthenium oxide, iron oxide, iridium oxide, chromium oxide, manganese oxide, tin oxide, cobalt oxide, or nickel oxide. Optionally, first electrode, 302, can be annealed to crystallize the material.

In the next step, bulk dielectric layer, 304, would then be formed on the first electrode layer, 302. A wide variety of dielectric materials have been targeted for use in DRAM capacitors. Examples of suitable dielectric materials comprise $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $Nb_2O_5$, $SrTiO_3$ (STO), $BaSrTiO_x$ (BST), $PbZrTiO_x$ (PZT), or doped versions of the same. These bulk dielectric materials may be formed as a single layer or may be formed as a hybrid or nanolaminate structure. A specific dielectric material of interest is doped $TiO_2$. Typically, Al is a common dopant used in TiO2 dielectrics to reduce the leakage current although many other dopants are also commonly used. Potential dopants as described previously comprise one or more of Al, Ge, Ga, Sr, Y, La, Zr, Hf, Sc, Nd, Ce, In, Sn, Er, Gd, Mg, Mn, Lu, Pr, Co, S, Se, Te, C, F, Cl, Br, I, P, As, Sb, or Bi. Typically, bulk dielectric layer, 304, is subjected to a post dielectric anneal (PDA) treatment before the formation of the next interface dielectric layer.

Second interface dielectric layer, 306, is formed on the bulk dielectric layer. As mentioned previously, second interface dielectric layer, 306, is typically an amorphous dielectric material with a k value between about 10 and about 30 and is less than about 1.5 nm in thickness. Advantageously, the thickness of each of the interface dielectric layers is less than about 1.0 nm. Examples of materials that would make suitable second interface dielectric layers comprise $Al_2O_3$, $La_2O_3$, $Si_xN_y$, $Lu_2O_3$, $ZrO_2$, $Er_2O_3$, MgO, $Ga_2O_3$, or combinations thereof.

The next step, comprises forming a second electrode layer, 308, on the second dielectric interface layer. The second electrode layer may be a metal, metal alloy, conductive metal oxide, conductive metal nitride, conductive metal silicide, or combinations thereof, etc. One class of materials that is of particular interest is the conductive metal oxides. Specific materials of interest comprise molybdenum oxide, tungsten oxide, ruthenium oxide, iron oxide, iridium oxide, chromium oxide, manganese oxide, tin oxide, cobalt oxide, or nickel oxide. Additional candidates for the second electrode material comprise TiN, Ni, TiAlN, Pt, Ir, Pd, Ni, Co, NiN, WN, VN, MoN, CoN, Ru, $RuO_2$, NiO, or combinations thereof. The remaining full DRAM device (not shown) would then be manufactured using well known techniques. Optionally, the DRAM capacitor stack may undergo a PMA treatment as discussed previously.

As an example, a dielectric material formed as part of a capacitor stack comprising $TiO_2$ doped with Al without a second interface dielectric layer (this sample also did not have a first interface dielectric layer) exhibited a leakage current of about $2 \times 10^{-7}$ $A/cm^2$ at a temperature of 25 C. This same stack exhibited a leakage current of about $2 \times 10^{-6}$ $A/cm^2$ at an elevated temperature of 90 C. However, a dielectric material formed as part of a capacitor stack comprising $TiO_2$ doped with Al with a $ZrO_2$ second interface dielectric layer (this sample also did not have a first interface dielectric layer) exhibited a leakage current of about $4 \times 10^{-8}$ $A/cm^2$ at a temperature of 25 C. This same stack exhibited a leakage current of about $2 \times 10^{-7}$ $A/cm^2$ at an elevated temperature of 90 C. Clearly, the capacitor stack with the second interface dielectric layer exhibits improved leakage current.

Figure 4:
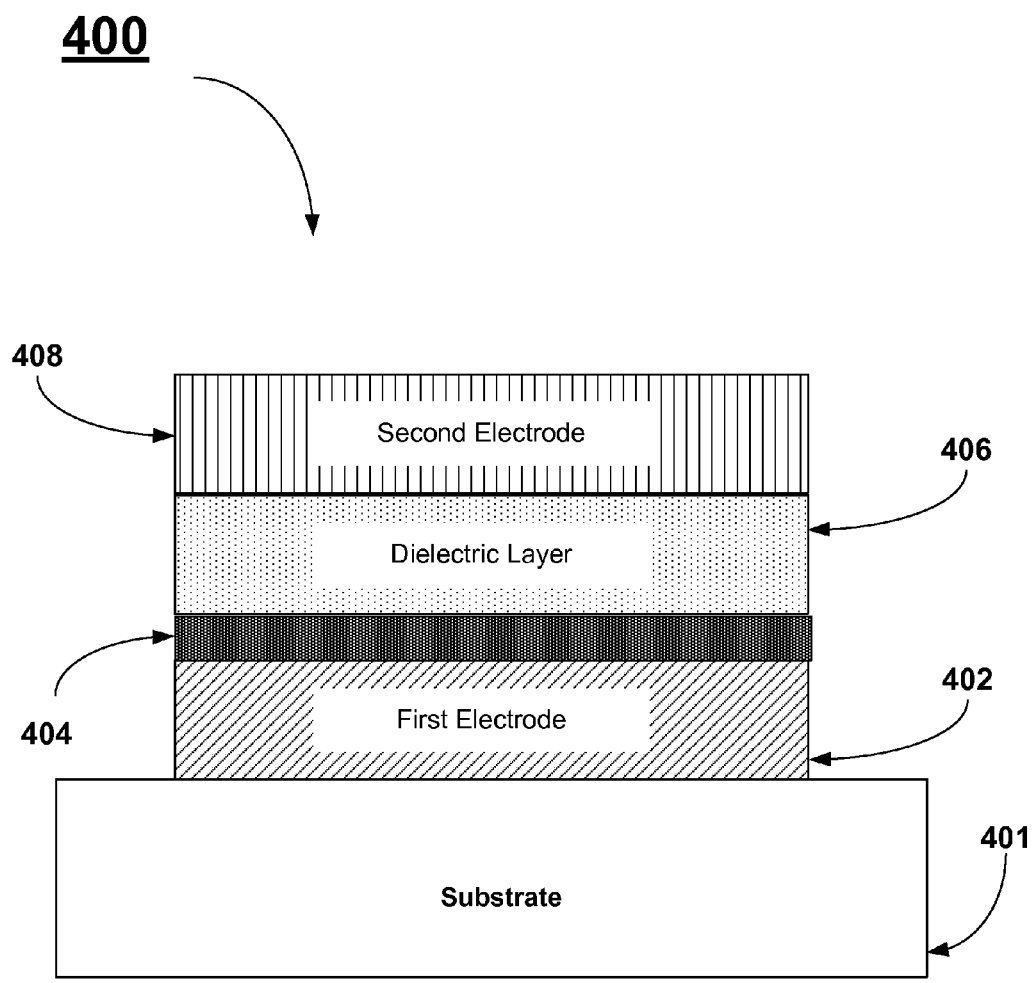
FIG. 4 illustrates a simplified cross-sectional view of a DRAM memory cell fabricated in accordance with some embodiments of the present invention.

FIG. 4 illustrates a simplified cross-sectional view of a DRAM capacitor stack fabricated in accordance with some embodiments of the present invention. In this configuration, only the first interface dielectric layer is used in the capacitor stack.

First electrode layer, 402, is formed on substrate, 401. Generally, the substrate has already received several processing steps in the manufacture of a full DRAM device. First electrode layer, 402, comprises one of metals, metal alloys, conductive metal oxides, conductive metal nitrides, conductive metal silicides, etc. One class of materials that is of particular interest is the conductive metal oxides. Specific materials of interest comprise molybdenum oxide, tungsten oxide, ruthenium oxide, iron oxide, iridium oxide, chromium oxide, manganese oxide, tin oxide, cobalt oxide, or nickel oxide. Optionally, first electrode, 402, can be annealed to crystallize the material.

First interface dielectric layer, 404, is formed on the bulk dielectric layer. As mentioned previously, first interface dielectric layer, 404, is typically an amorphous dielectric material with a k value between about 10 and about 30 and is less than about 1.5 nm in thickness. Advantageously, the thickness of each of the interface dielectric layers is less than about 1.0 nm. Examples of materials that would make suitable first interface dielectric layers comprise $Al_2O_3$, $La_2O_3$, $Si_xN_y$, $Lu_2O_3$, $ZrO_2$, $Er_2O_3$, MgO, $Ga_2O_3$, or combinations thereof.

In the next step, bulk dielectric layer, 406, would then be formed on the first dielectric interface layer, 404. A wide variety of dielectric materials have been targeted for use in DRAM capacitors. Examples of suitable dielectric materials comprise $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $Nb_2O_5$, $SrTiO_3$ (STO), $BaSrTiO_x$ (BST), $PbZrTiO_x$ (PZT), or doped versions of the same. These bulk dielectric materials may be formed as a single layer or may be formed as a hybrid or nanolaminate structure. A specific dielectric material of interest is doped $TiO_2$. Typically, Al is a common dopant used in $TiO_2$ dielectrics to reduce the leakage current although many other dopants are also commonly used. Potential dopants as described previously comprise one or more of Al, Ge, Ga, Sr, Y, La, Zr, Hf, Sc, Nd, Ce, In, Sn, Er, Gd, Mg, Mn, Lu, Pr, Co, S, Se, Te, C, F, Cl, Br, I, P, As, Sb, or Bi. Typically, bulk dielectric layer, 406, is subjected to a post dielectric anneal (PDA) treatment before the formation of the next dielectric interface layer.

The next step, comprises forming a second electrode layer, 408, on the bulk dielectric layer. The second electrode layer may be a metal, metal alloy, conductive metal oxide, conductive metal nitride, conductive metal silicide, or combinations thereof, etc. One class of materials that is of particular interest is the conductive metal oxides. Specific materials of interest comprise molybdenum oxide, tungsten oxide, ruthenium oxide, iron oxide, iridium oxide, chromium oxide, manganese oxide, tin oxide, cobalt oxide, or nickel oxide. Additional candidates for the second electrode material comprise TiN, Ni, TiAlN, Pt, Ir, Pd, Ni, Co, NiN, WN, VN, MoN, CoN, Ru, $RuO_2$, NiO, or combinations thereof. The remaining full DRAM device (not shown) would then be manufactured using well known techniques. Optionally, the DRAM capacitor stack may undergo a PMA treatment as discussed previously.

Figure 5:
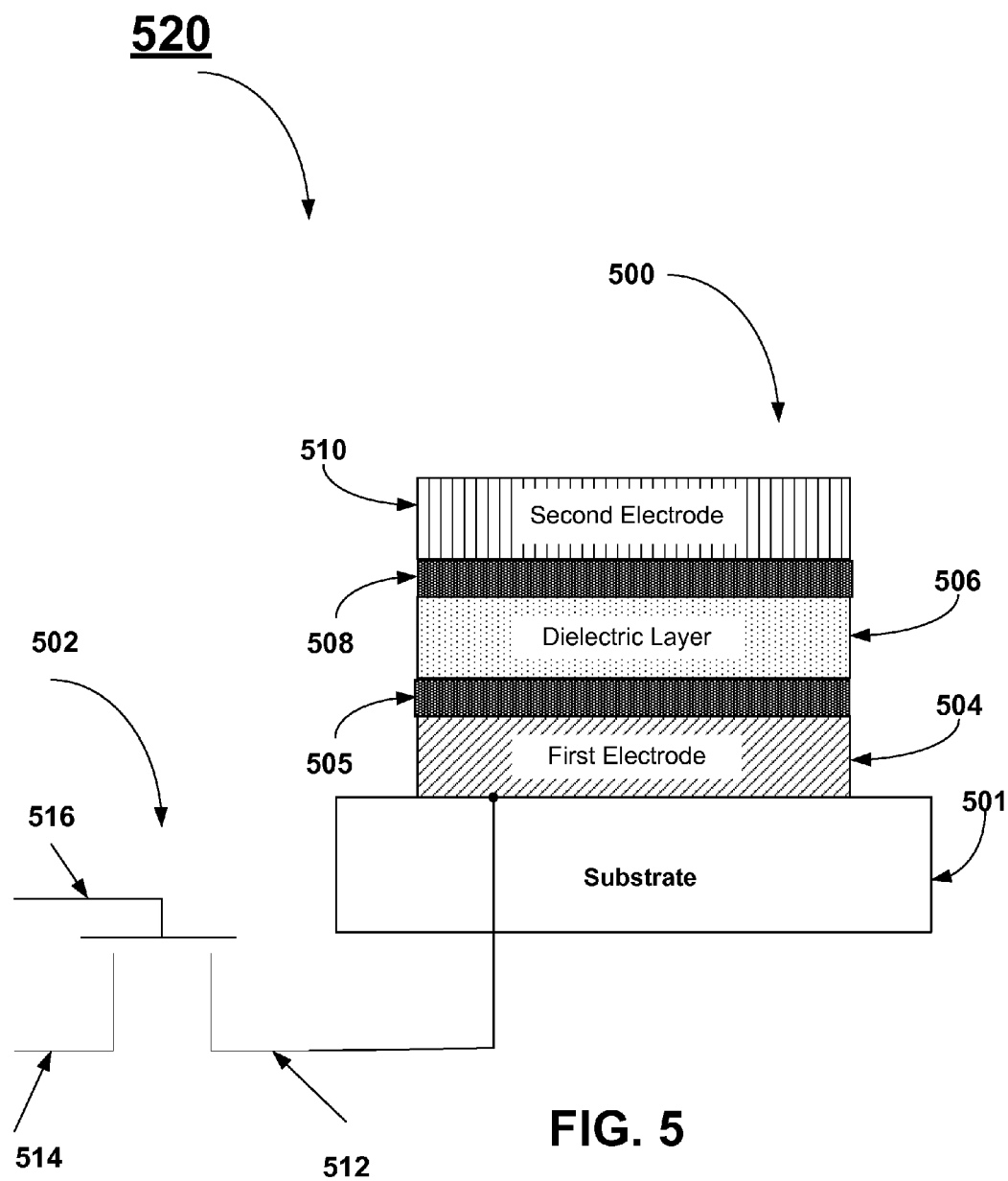
FIG. 5 illustrates a simplified cross-sectional view of a DRAM memory cell fabricated in accordance with some embodiments of the present invention.

An example of a specific application of some embodiments of the present invention is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 5 is used to illustrate one DRAM cell, 520, manufactured using a bilayer second electrode structure as discussed previously. The cell, 520, is illustrated schematically to include two principle components, a cell capacitor, 500, and a cell transistor, 502. The cell transistor is usually constituted by a MOS transistor having a gate, 516, source, 512, and drain, 514. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously, the cell capacitor, 500, comprises a first electrode, 504, formed on substrate, 501. The first electrode, 504, is connected to the source or drain of the cell transistor, 502. For illustrative purposes, the first electrode has been connected to the source, 512, in this example. First electrode layer, 504, comprises one of metals, metal alloys, conductive metal oxides, conductive metal nitrides, conductive metal silicides, etc. One class of materials that is of particular interest is the conductive metal oxides. Specific materials of interest comprise molybdenum oxide, tungsten oxide, ruthenium oxide, iron oxide, iridium oxide, chromium oxide, manganese oxide, tin oxide, cobalt oxide, or nickel oxide. For the purposes of illustration, first electrode, 504, will be crystalline $MoO_2$ in this example. As discussed previously, first electrode, 504, may be subjected to an anneal in a reducing atmosphere before the formation of the dielectric layer to crystallize the $MoO_2$ and to reduce any $MoO_{2+x}$ compounds that may have formed during the formation of the first electrode. First interface dielectric layer, 505, is formed on the first electrode. As mentioned previously, first interface dielectric layer, 505, is typically an amorphous dielectric material with a k value between about 10 and about 30 and is less than about 1.5 nm in thickness. Advantageously, the thickness of each of the interface dielectric layers is less than 1.0 nm. Examples of materials that would make suitable first interface dielectric layers comprise $Al_2O_3$, $La_2O_3$, $Si_xN_y$, $Lu_2O_3$, $ZrO_2$, $Er_2O_3$, MgO, $Ga_2O_3$, or combinations thereof. In some embodiments, the first interface dielectric layer, 505, is not present. Bulk dielectric layer, 506, is formed on top of the first electrode. Examples of suitable dielectric materials comprise $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $Nb_2O_5$, $SrTiO_3$ (STO), $BaSrTiO_x$ (BST), $PbZrTiO_x$ (PZT), or doped versions of the same. These bulk dielectric materials may be formed as a single layer or may be formed as a hybrid or nanolaminate structure. A specific dielectric material of interest is doped $TiO_2$. Typically, Al is a common dopant used in TiO2 dielectrics to reduce the leakage current although many other dopants are also commonly used. Potential dopants as described previously comprise one or more of Al, Ge, Ga, Sr, Y, La, Zr, Hf, Sc, Nd, Ce, In, Sn, Er, Gd, Mg, Mn, Lu, Pr, Co, S, Se, Te, C, F, Cl, Br, I, P, As, Sb, or Bi. For the purposes of illustration, bulk dielectric layer, 506, will be rutile-phase $TiO_2$. As discussed previously, the $TiO_2$ may be doped. Typically, the bulk dielectric layer is then subjected to a PDA treatment. Second interface dielectric layer, 508, is formed on the bulk dielectric layer. As mentioned previously, interface second dielectric layer, 508, is typically an amorphous dielectric material with a k value between about 10 and about 30 and is less than about 1.5 nm in thickness. Advantageously, the thickness of each of the interface dielectric layers is less than 1.0 nm. Examples of materials that would make suitable second interface dielectric layers comprise $Al_2O_3$, $La_2O_3$, $Si_xN_y$, $Lu_2O_3$, $ZrO_2$, $Er_2O_3$, MgO, $Ga_2O_3$, or combinations thereof. The next step, comprises forming a second electrode layer, 510, on the second interface dielectric layer. The second electrode layer may be a metal, metal alloy, conductive metal oxide, conductive metal nitride, conductive metal silicide, or combinations thereof, etc. One class of materials that is of particular interest is the conductive metal oxides. Specific materials of interest comprise molybdenum oxide, tungsten oxide, ruthenium oxide, iron oxide, iridium oxide, chromium oxide, manganese oxide, tin oxide, cobalt oxide, or nickel oxide. Additional candidates for the second electrode material comprise TiN, Ni, TiAlN, Pt, Ir, Pd, Ni, Co, NiN, WN, VN, MoN, CoN, Ru, $RuO_2$, NiO, or combinations thereof. The remaining full DRAM device (not shown) would then be manufactured using well known techniques. Optionally, the DRAM capacitor stack may undergo a PMA treatment as discussed previously. This completes the formation of the capacitor stack.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a capacitor stack, the method comprising:
    forming a first electrode layer on a substrate;
    forming a first interface dielectric layer on the first electrode layer,
        wherein the k value of the first interface dielectric layer is between about 10 and about 30,
        wherein the first interface dielectric layer comprises one of $La_2O_3$, $Lu_2O_3$, $Er_2O_3$, MgO, $Ga_2O_3$, or combinations thereof;
    forming a bulk dielectric layer on the first interface dielectric layer,
        wherein the k value of the bulk dielectric layer is at least about 40;
    forming a second interface dielectric layer on the bulk dielectric layer
        wherein the k value of the second interface dielectric layer is between about 10 and about 30,
        wherein the first interface dielectric layer and the second interface dielectric layer directly interface the bulk dielectric layer and increase a barrier height between the first electrode layer and the bulk dielectric layer and a barrier height between the second electrode layer and the bulk dielectric layer; and
    forming a second electrode on the second interface dielectric layer.

2. The method of claim 1, wherein a thickness of each of the first and second interface dielectric layers is less than about 1.5 nm.

3. The method of claim 2, wherein the thickness of each of the first and second interface dielectric layers is less than about 1.0 nm.

4. The method of claim 1, wherein each of the first interface dielectric layer and the second interface dielectric layer is amorphous.

5. The method of claim 1, wherein the second interface dielectric layer comprises one of $La_2O_3$, $Si_xN_y$, $Lu_2O_3$, $Er_2O_3$, MgO, $Ga_2O_3$, or combinations thereof.

6. The method of claim 1, wherein the bulk dielectric layer comprises $TiO_2$ and a dopant, wherein the dopant comprises one or more of Al, Ge, Ga, Sr, Y, La, Zr, Hf, Sc, Nd, Ce, In, Sn, Er, Gd, Mg, Mn, Lu, Pr, Co, S, Se, Te, C, F, Cl, Br, I, P, As, Sb, or Bi.

7. A method for forming a capacitor stack, the method comprising:
　forming a first electrode layer on a substrate;
　forming a bulk dielectric layer on the first electrode layer,
　　wherein the k value of the bulk dielectric layer is at least about 40;
　forming a second interface dielectric layer on the bulk dielectric layer
　　wherein the k value of the second interface dielectric layer is between about 10 and about 30,
　　wherein the second interface dielectric layer comprises one of $La_2O_3$, $Lu_2O_3$, $Er_2O_3$, MgO, $Ga_2O_3$, or combinations thereof;
　　wherein the second interface dielectric layer directly interfaces the bulk dielectric layer and increases a barrier height between the second electrode layer and the bulk dielectric layer; and
　forming a second electrode on the second interface dielectric layer.

8. The method of claim 7, wherein a thickness of the second interface dielectric layer is less than about 1.5 nm.

9. The method of claim 8, wherein the thickness of the second interface dielectric layer is less than about 1.0 nm.

10. The method of claim 7, wherein the second interface dielectric layer is amorphous.

11. The method of claim 7, wherein the bulk dielectric layer comprises $TiO_2$ and a dopant, and wherein the dopant comprises one or more of Al, Ge, Ga, Sr, Y, La, Zr, Hf, Sc, Nd, Ce, In, Sn, Er, Gd, Mg, Mn, Lu, Pr, Co, S, Se, Te, C, F, Cl, Br, I, P, As, Sb, or Bi.

12. A method for forming a capacitor stack, the method comprising:
　forming a first electrode layer on a substrate;
　forming a first interface dielectric layer on the first electrode layer
　　wherein the k value of the first interface dielectric layer is between about 10 and about 30,
　　wherein the first interface dielectric layer comprises one of $La_2O_3$, $Lu_2O_3$, $Er_2O_3$, MgO, $Ga_2O_3$, or combinations thereof;
　forming a bulk dielectric layer on the first interface dielectric layer,
　　wherein the k value of the bulk dielectric layer is at least about 40;
　　wherein the first interface dielectric layer directly interfaces the bulk dielectric layer and increases a barrier height between the first electrode layer and the bulk dielectric layer; and
　forming a second electrode on the bulk dielectric layer.

13. The method of claim 12, wherein the bulk dielectric layer comprises $TiO_2$ and a dopant, and wherein the dopant comprises one or more of Al, Ge, Ga, Sr, Y, La, Zr, Hf, Sc, Nd, Ce, In, Sn, Er, Gd, Mg, Mn, Lu, Pr, Co, S, Se, Te, C, F, Cl, Br, I, P, As, Sb, or Bi.

14. The method of claim 1, wherein the bulk dielectric layer is a nanolaminate.

15. The method of claim 1, wherein the bulk dielectric comprises titanium oxide doped with aluminum.

16. The method of claim 1, wherein, prior to forming the second interface dielectric layer, the capacitor stack comprising the substrate, the first electrode layer, the first interface dielectric layer, and the bulk dielectric layer is annealed.

17. The method of claim 1, wherein the first interface dielectric layer and the second interface dielectric layer have different composition.

18. The method of claim 1, wherein the first electrode layer comprises a metal oxide.

19. The method of claim 1, wherein the first electrode layer comprises one of molybdenum oxide, tungsten oxide, ruthenium oxide, iron oxide, iridium oxide, chromium oxide, manganese oxide, tin oxide, cobalt oxide, or nickel oxide.

20. The method of claim 1, wherein the first interface dielectric layer comprises a combination of two or more of $La_2O_3$, $Lu_2O_3$, $Er_2O_3$, MgO, or $Ga_2O_3$.

* * * * *